Figure 1A:
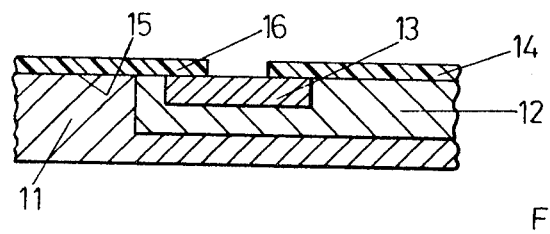

United States Patent [19]
Dormer et al.

[11] 4,106,051
[45] Aug. 8, 1978

[54] SEMICONDUCTOR DEVICES

[75] Inventors: Leslie Dormer, Stockport; Roy Nuttall, Cheadle, both of England

[73] Assignee: Ferranti Limited, Hollinwood, England

[21] Appl. No.: 543,181

[22] Filed: Jan. 22, 1975

Related U.S. Application Data

[62] Division of Ser. No. 413,894, Nov. 8, 1973, Pat. No. 3,881,242.

[51] Int. Cl.$^2$ ............................................. H01L 23/48
[52] U.S. Cl. .......................................... 357/71; 357/59
[58] Field of Search ..................................... 357/59, 71

[56] References Cited

U.S. PATENT DOCUMENTS

| | | | |
|---|---|---|---|
| 3,614,547 | 10/1971 | May | 357/71 |
| 3,632,436 | 1/1972 | Denning | 357/71 |
| 3,667,008 | 5/1972 | Katnack | 357/71 |
| 4,042,953 | 8/1977 | Hall | 357/71 |

*Primary Examiner*—Edward J. Wojciechowicz
*Attorney, Agent, or Firm*—Cameron, Kerkam, Sutton, Stowell & Stowell

[57] ABSTRACT

A semiconductor device having an ohmic contact including a metal layer of molybdenum or tungsten on a first polycrystalline silicon layer, is provided with a second polycrystalline silicon layer on the metal layer, to prevent the subsequent oxidation of the metal layer.

4 Claims, 7 Drawing Figures

SEMICONDUCTOR DEVICES

This is a division of application Ser. No. 413,894, filed Nov. 8, 1973 now U.S. Pat. No. 3,881,242.

This invention relates to semiconductor devices, and in particular to devices each having a monocrystalline silicon semiconductor body, a silicon oxide passivating layer on the monocrystalline semiconductor body, and at least one ohmic contact extending both through an aperture in the passivating layer to the semiconductor body and on portions of the silicon oxide layer adjacent to the aperture, the contact including a tungsten or a molybdenum layer.

A layer of each of these metals adheres well to silicon. However, such a layer deposited from the vapour of a compound of the metal does not form a satisfactory bond with an underlying silicon oxide layer. Deposition of tungsten or molybdenum by a chemical reaction with a vapour of a compound of the metal is desirable because the metal is deposited in a denser form than when deposited from a vapour of the metal or by sputtering. In addition, in the former process, the metal layer is less affected by the relief profile of the surface upon which the deposition occurs than when deposited by the other methods. Also the metal is deposited from an oxygen-free atmosphere so that the deposited metal is not contaminated by oxygen. Tungsten or molybdenum when deposited from the vapour of a metal compound is additionally suitable for inclusion in an ohmic contact for a silicon semiconductor device because each has a co-efficient of thermal expansion similar to that of silicon, each has a high co-efficient of electrical conductivity, and each may be etched easily by photolithographic techniques. Hence, it is known to have an ohmic contact on a monocrystalline silicon body comprising a layer of tungsten or molybdenum on a layer of polycrystalline silicon, the polycrystalline layer adhering well to the metal layer, and to both the monocrystalline body and the passivating layer of silicon oxide on the body.

However, the surface portion of a tungsten or molybdenum layer remote from the polycrystalline layer has a tendency to oxidise when exposed to air or oxygen, and this renders it difficult to provide a satisfactory electrical connection to the metal layer. It is known to provide a layer of gold or aluminium on the tungsten or molybdenum layer to complete the contact so that an electrical connection may be bonded to the contact, but a gold or aluminium layer will not adhere satisfactorily to the tungsten or molybdenum layer if the latter has an oxidised surface portion.

It is an object of the present invention to provide a novel and advantageous construction for an ohmic contact in a semiconductor device, the ohmic contact including a layer of tungsten or molybdenum on a layer of polycrystalline silicon, and extending both to a monocrystalline silicon semiconductor body through an aperture in a passivating layer of silicon oxide on the body, and on portions of the silicon oxide layer adjacent to the aperture.

According to the present invention a semiconductor device with a passivating layer of silicon oxide on at least one surface of a monocrystalline silicon semiconductor body, and an ohmic contact extending both to a part of said surface of the semiconductor body exposed through an aperture in the passivating layer and on portions of the passivating layer adjacent to the aperture, has the ohmic contact comprising a first polycrystalline silicon layer on the passivating layer and within the aperture in the passivating layer, a metal layer of tungsten or molybdenum on the first polycrystalline layer, and a second polycrystalline silicon layer on the metal layer.

The second polycrystalline silicon layer adheres well to the metal layer, and its presence prevents the subsequent formation of a surface oxide layer on the metal layer.

The second polycrystalline layer, conveniently, may be provided within the same deposition apparatus as, and in a consecutive process step with the formation of, the metal layer, and as described and claimed in our co-pending patent application Ser. No. 413,894 now U.S. Pat. No. 3,881,242, the present application having been divided therefrom. Thus, there is no possibility of the surface portion of the metal layer inadvertently becoming oxidised.

An electrical connection may be made directly to the second polycrystalline layer. Alternatively, the ohmic contact may be completed by gold or aluminium deposited onto the second polycrystalline layer. The second polycrystalline layer is required to have a thickness so that a satisfactory electrical connection may be made to the ohmic contact, for example, so that when gold is provided the gold may penetrate into the second polycrystalline layer forming an inter-metallic compound therewith.

Figure 1B:
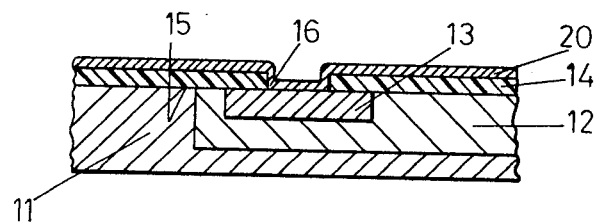
Figure 1C:
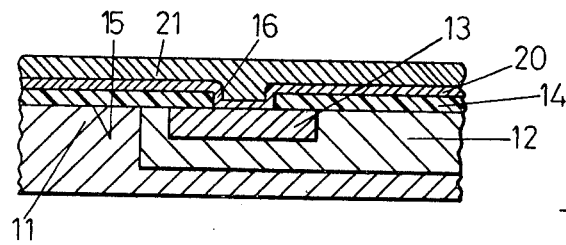
Figure 1D:
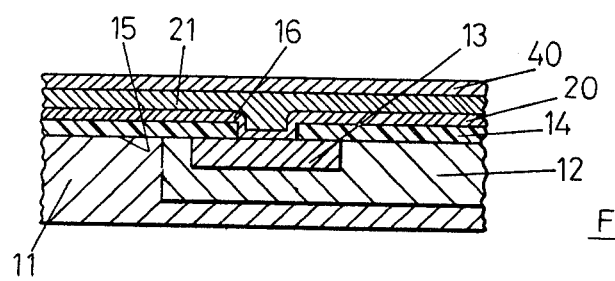
Figure 1E:
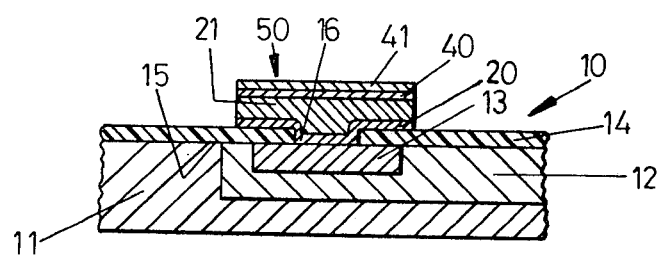

The present invention will now be described by way of example with reference to the accompanying drawings, in which:

FIGS. 1a to 1e each comprise a section of part of a transistor semiconductor device at different successive stages in the provision of an ohmic contact to the emitter, FIG. 1e illustrating the completed ohmic contact.

Figure 2:
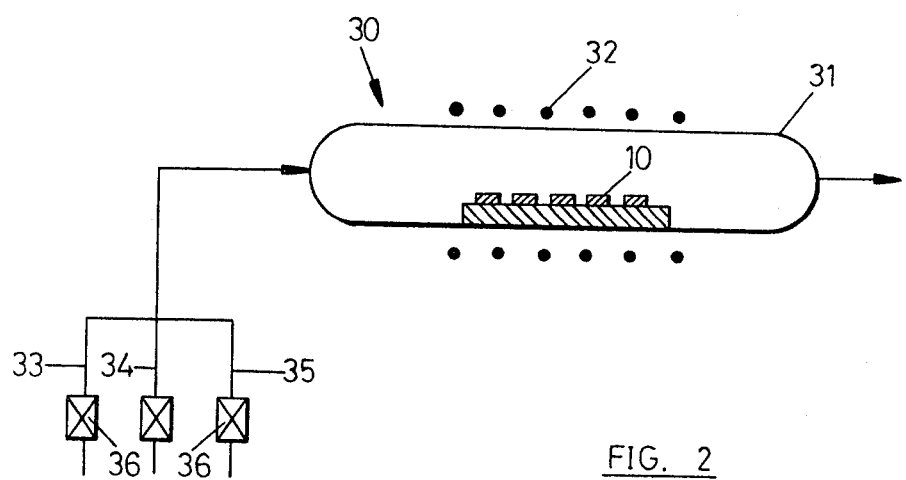
Figure 3:
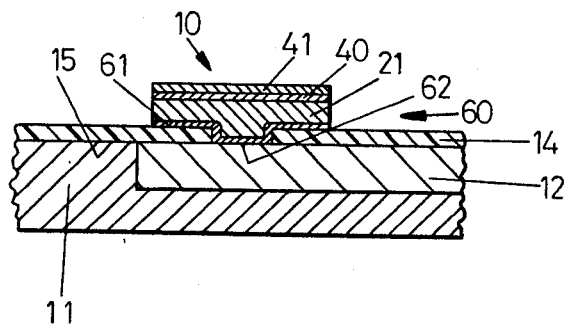

FIG. 2 is a partly-diagrammatic section of deposition apparatus employed in providing the ohmic contact, and FIG. 3 corresponds to FIG. 1e but shows part of a transistor having a modified construction.

The transistor 10 illustrated partially in FIG. 1e comprises a monocrystalline silicon semiconductor body 11, FIGS. 1a to 1e illustrating successive stages in the provision of an ohmic contact for the emitter. Initially the monocrystalline body is wholly of N conductivity type, but a P type base 12 and an N type emitter 13 are formed by known diffusion steps, and as shown in FIG. 1a, during the diffusion steps, or subsequently thereto, a passivating silicon oxide layer 14 is provided on a surface 15 of the monocrystalline body and over the base 12 and the emitter 13. An aperture 16 is provided in the passivating layer 14, by known photolithographic techniques, to expose a region of the emitter 13.

The ohmic contact to the emitter 13 is required both to extend through the aperture 16 in the passivating layer 14 and to extend on and to be secured to the adjacent portions of the passivating layer. The ohmic contact is formed by including a tungsten layer, the tungsten layer being deposited from a vapour of tungsten hexafluoride in conventional deposition apparatus. The deposited layer has a dense form, and whilst alone it would adhere well to the exposed region of the monocrystalline silicon body 11, it would not be securely bonded to the passivating layer 14. Thus, the ohmic contact is provided, for example, in the manner described and claimed in our aforementioned co-pending patent application Ser. No. 413,894, the present application having been divided therefrom.

As shown in FIG. 1b, the ohmic contact includes a layer 20 of polycrystalline silicon deposited within the deposition apparatus before the deposition of the metal layer. The polycrystalline layer 20 is sufficiently thick to be bonded to the passivating layer 14 and to enable the metal layer, when deposited, to be bonded to the polycrystalline layer 20, the polycrystalline layer 20 having a thickness to the range 200Å to 500Å. The polycrystalline layer 20 is of N conductivity type, an appropriate conductivity-type-determining impurity being included in the atmosphere within the deposition apparatus from which the polycrystalline layer is deposited. Thus, no significant amount of impurity is transferred between the emitter 13 and the polycrystalline layer 20; and the polycrystalline layer 20 does not introduce any significant resistance into the ohmic contact.

As shown in FIG. 1c, the metal layer 21 is then deposited on the polycrystalline layer 20. The presence of a portion of the polycrystalline layer between the emitter 13 and the metal layer 21, and forming an ohmic contact to the emitter, does not reduce the strength of the bond of the metal layer to the monocrystalline silicon body 11.

The polycrystalline silicon layer 20 and the metal layer 21 are deposited consecutively in the deposition apparatus 30 shown in FIG. 2. The apparatus 30 comprises a chamber 31, in which the deposition atmospheres are provided, and heating means indicated generally at 32. Three passages are provided into the chamber 31, a passage 33 connected to a source (not shown) of silane doped with impurity, the silane being mixed with phosphine gas if the impurity is phosphorus, a passage 34 connected to a source of nitrogen (not shown), and a passage 35 connected to a source of tungsten hexafluoride (not shown). Each passage, 33, 34 and 35 is provided with a valve 36 controlling the flow of the vapour or the gas from the associated supply to the chamber 31.

Initially the deposition atmosphere maintained in the chamber 31 is silane, the gaseous dopant, and the inert diluent nitrogen. From this atmosphere the doped polycrystalline silicon layer 20 is deposited. Subsequently, tungsten hexafluoride is introduced into the chamber 31 to modify the deposition atmosphere therein, and the tungsten layer 21 is deposited instead of the silicon. The silane present in the modified atmosphere reduces the tungsten hexafluoride.

Because the tungsten layer 21 oxidises in the presence of air or oxygen, as shown in FIG. 1d, and in accordance with the present invention, the metal layer 21 is coated with a second polycrystalline silicon layer 40 before the device 10 is removed from the deposition apparatus 30. Because the ohmic contact 50 is formed within the deposition apparatus 30 in an oxygen-free atmosphere the metal layer 21 is not contaminated by oxygen when deposited. The second polycrystalline layer 40 is provided merely by stopping the supply of tungsten hexafluoride to the chamber 31.

The temperature of the atmospheres within the chamber 31 is maintained throughout these deposition steps in the range 700° to 750° C.

As shown in FIG. 1e, the ohmic contact 50 is completed by depositing gold by evaporation onto the second polycrystalline layer 40 to form an inter-metallic compound 41 therewith. An electrical connection easily may be made to the inter-metallic compound 41 and, hence, to the ohmic contact 50. The second polycrystalline layer 40 is sufficiently thick to be bonded to the metal layer 21 and to form the inter-metallic compound 41. The second polycrystalline layer 40 also is doped and does not introduce any significant resistance into the ohmic contact.

At least the different layers 20, 21 and 40 of the ohmic contact 50 are deposited in an initially-continuous form and are etched by known photolithographic techniques in providing the contact 50.

The metal layer 21 has a dense form with good current-carrying properties, the dense form being obtainable when the metal layer is deposited from a vapour of a metal compound. Another advantage of this method of depositing the metal is that the deposited layer is less significantly affected by the profile of the surface upon which it is deposited than when deposited from a vapour of the metal or by sputtering.

The construction of an ohmic contact according to the present invention, and as described above, may be modified in various ways.

A desired finite resistance may be introduced into the ohmic contact by at least one of the polycrystalline layers, such a finite resistance being required for the satisfactory performance of the semiconductor device. The thickness of each polycrystalline layer is arranged to be such that the required resistance is obtained with the impurity concentration in the deposited polycrystalline layer.

Conductivity-type-determining impurity may be transferred to the monocrystalline body from the first deposited polycrystalline layer.

In another construction a P-N junction is obtained by the deposition of the first polycrystalline layer, this P-N junction possibly being adjacent to the interface between the polycrystalline layer and the monocrystalline body. Such a semiconductor device comprising a transistor is illustrated partially at 60 in FIG. 3. Parts of the device of FIG. 3 identical to or closely resembling parts of the device of FIG. 1e are identified by the same reference numbers as the parts of FIG. 1e. However, in the transistor 60 of FIG. 3 the N-type emitter 61 is provided within the first polycrystalline layer 20 on the P-type base exposed through the aperture 62 in the passivating layer 14.

The metal layer may be of molybdenum, molybdenum hexafluoride being introduced into the deposition apparatus instead of the tungsten hexafluoride.

The electrical connection to the metal layer may be obtained in various different ways. Aluminium may be deposited on the second polycrystalline layer 40 instead of gold. Alternatively, it may be possible to obviate the need to provide the gold or aluminium layer.

Argon may comprise the inert diluent within the chamber 31 instead of nitrogen.

Each polycrystalline layer may not be deposited in a doped form, no conductivity-type-determining impurity being supplied to the deposition apparatus. In such a process conductivity-type-determining impurity may be transferred to the first deposited polycrystalline layer from the contiguous region of the monocrystalline semiconductor body, for example, to ensure that the resistance of the ohmic contact is lower than would otherwise be the case.

What we claim is:

1. A semiconductor device comprising a passivating layer of silicon oxide on at least one surface of a monocrystalline silicon semiconductor body and an ohmic contact extending both to a part of said surface of the semiconductor body exposed through an aperture in the passivating layer and on portions of the passivating layer adjacent to the aperture, including a first polycrystalline silicon layer on the passivating layer and extending within the aperture in the passivating layer, a layer of a metal selected from the group consisting of tungsten and molybdenum on the first polycrystalline layer, and a second polycrystalline silicon layer on the metal layer, at least one of the polycrystalline layers including a finite resistance, the thickness of said at least one layer being in the range 200 Å to 500 Å such that the resistance is obtained by an impurity concentration in the layer to provide for the satisfactory operation of the semiconductor device, and the ohmic contact further including on said second polycrystalline silicon layer a further metal layer selected from the group consisting of gold and aluminum to facilitate making electrical connection to the ohmic contact.

2. A device as claimed in claim 1 in which the polycrystalline layers are doped.

3. A device as claimed in claim 2 in which at least the first polycrystalline layer is of one conductivity type and the region of the monocrystalline semiconductor body exposed through the aperture in the silicon oxide passivating layer is of the opposite conductivity type, a P-N junction being adjacent to the interface between the first polycrystalline layer and the monocrystalline semiconductor body.

4. A transistor comprising a monocrystalline silicon semiconductor body wholly of N conductivity type, a P type base and an N type emitter formed in said monocrystalline body, a passivating silicon oxide layer on a surface of the monocrystalline body and over the base and the emitter, and having an aperture exposing a region of the emitter, an ohmic contact to the emitter extending through the aperture in the passivating layer and extending on and secured to the adjacent portions of the passivating layer, said ohmic contact including a first polycrystalline silicon layer of N conductivity type on the passivating layer and extending within the aperture in the passivating layer, the thickness of the first polycrystalline layer being in the range 200Å to 500Å, a layer of a metal selected from the group consisting of tungsten and molybdenum on the first polycrystalline layer, a second polycrystalline silicon layer on the metal layer and a layer of metal on the second polycrystalline silicon layer selected from the group consisting of gold and aluminum to facilitate electrical connection to the ohmic contact.

* * * * *

UNITED STATES PATENT AND TRADEMARK OFFICE
CERTIFICATE OF CORRECTION

PATENT NO. : 4,106,051

DATED : August 8, 1978

INVENTOR(S) : Leslie Dormer et al.

It is certified that error appears in the above-identified patent and that said Letters Patent are hereby corrected as shown below:

Cover sheet, after Item [62], insert
--[30] Foreign Application Priority Data
  November 8, 1972 Great Britain 51566/72
  December 12, 1974 Great Britain 53717/74--

Signed and Sealed this

Sixth Day of March 1979

[SEAL]

Attest:

RUTH C. MASON
Attesting Officer

DONALD W. BANNER
Commissioner of Patents and Trademarks